(12) United States Patent
Risen, Jr. et al.

(10) Patent No.: US 6,248,852 B1
(45) Date of Patent: Jun. 19, 2001

(54) GERMANOSILOXANE MATERIALS AND OPTICAL COMPONENTS COMPRISING THE SAME

(76) Inventors: William M. Risen, Jr., 87 Miller Ave., Rumford, RI (US) 02916; Yong Zhong Wang, 30 E. Transit St., #3, Providence, RI (US) 02912; Athena Honore, 3172 24th St., Apt. 204, San Francisco, CA (US) 94110-4001

( * ) Notice: Subject to any disclaimer, the term of this patent is extended or adjusted under 35 U.S.C. 154(b) by 0 days.

(21) Appl. No.: 09/091,393

(22) PCT Filed: Dec. 19, 1996

(86) PCT No.: PCT/US96/20678

§ 371 Date: Oct. 1, 1998

§ 102(e) Date: Oct. 1, 1998

(87) PCT Pub. No.: WO97/22653

PCT Pub. Date: Jun. 26, 1997

Related U.S. Application Data

(60) Provisional application No. 60/009,001, filed on Dec. 19, 1995.

(51) Int. Cl.[7] ............................. C08G 79/00; C08F 6/12; B05D 3/02
(52) U.S. Cl. ............................. 528/9; 528/395; 528/481; 528/482; 427/374.7; 428/336
(58) Field of Search ................................. 528/9, 395, 481, 528/482; 427/374.7; 428/336

(56) References Cited

U.S. PATENT DOCUMENTS 3,510,502 * 5/1970 Moedritzer .
5,130,397 * 7/1992 Zeigler ..................................... 528/9
5,391,638 * 2/1995 Katsouluis et al. ................... 525/389
5,831,105 * 11/1998 Aulbach et al. ........................ 556/11

OTHER PUBLICATIONS

Hackh's Chemical Dictionary. Grant, J. ed. 1969. pp. 27, 101, 223, 425, 427.*

* cited by examiner

*Primary Examiner*—Robert Dawson
*Assistant Examiner*—Jeffrey B. Robertson
(74) *Attorney, Agent, or Firm*—Fay, Sharpe, Fagan, Minnich & McKee, LLP

(57) ABSTRACT

The present invention is directed to a method of forming germanium-containing silicones in which germanium is incorporated into the siloxane backbone with Ge—O—Si bond or onto a carboxylated siloxane in a form such as the germanium ester form, which has a COOGe bond. The germanium mole content ranges from 1 mol % to 50 mol %. The groups attached to silicon and/or germanium include alkyl, alkenyl, and carboxyalkyl and their derivatives. In the materials with pendant carboxylic acid groups, the protons can be replaced by metal ions such as an alkali, alkaline earth, transition metal, or rare earth metal ions. The materials can be crossinked, with the crosslinking being initiated by ultraviolet light or other means with or without a photoinitiator. The present invention is also directed to a method of forming a germanium-containing silicate film on a substrate such as silicon or other material wafer through thermal oxidation or other oxidation methods such as those utilized in planar waveguide applications.

45 Claims, No Drawings

GERMANOSILOXANE MATERIALS AND OPTICAL COMPONENTS COMPRISING THE SAME

This application claims the benefit of U.S. Provisional Application No. 60/009,001, filed Dec. 19, 1995.

This invention was made with government support under Contract No. F-49620-93-1-0049 from the U.S. Air Force Office of Scientific Research. Consequently, the Government may have certain rights in this invention.

FIELD OF THE INVENTION

This invention pertains to the field of optical devices and will be described with specific references thereto. However, it will be appreciated that the invention has broader applications and may be advantageously employed in other environments and applications.

BACKGROUND OF THE INVENTION

The present invention relates to the formation of novel germanosiloxane compounds which can be used as spin-on-glass precursors, optically useful films, and precursors to other germania- and silica- based glass objects. It also relates to a method of forming these objects, including germania-silica based glass films, microlenses, lasers, adhesive layers and other glass objects.

Generally, germanium-oxygen bond containing compounds or germoxanes are synthesized through hydrolysis of germanium halides. Since the germanium-oxygen bond is relatively weak and quite subject to hydrolysis by water, the synthesis of certain polygermoxane compounds has to be carried out under non-aqueous conditions. Recently, certain polygermoxanes with formula $(R_1R_2GeO)_n$ (n=3–50) were synthesized through reaction between a germanium hydrocarbyl dihalide and a hydrocarbyllithium [U.S. Pat. No. 5,391,792]. Polygermoxanes with formula $(RGeO_{1.5})_n$ also were synthesized through the photooxidation of polygermynes [W. J. Szymanski, G. T. Visscher, and P. A. Bianconi, *Macromolecules*, 26, 869(1993)].

Small germoxane compounds have been synthesized through different methods [M. P. Brown and E. G. Rochow, *J. Am. Chem. Soc.*, 82, 4166(1960); H. Puff, S. Franken, W. Schuh, and W. Schwab, *J. Organometal Chem.*, 254, 31(1983); L. Roβ and M. Dräger, *Z. Naturforsch*, 39b, 868(1984); S. Masamune, S. Batcheller, J. Park, W. M. Davis, O. Yamashita, Y. Ohta, and Y. Kabe, *J. Am. Chem. Soc.*, 111, 1889(1989)]. Small germanosiloxane compounds with one or more Ge—O—Si bond have been synthesized [F. Glockling, *The Chemistry of Germanium*, Academic Press, London(1969); M. Lesbre, P. Mazerolles, and J. Satge, *The Organic Compounds of Germanium*, John Wiley & Sons, London(1971)]. Other germanosiloxane ring compounds were also synthesized through the reaction of diallylsilanediols and germanium halides [H. Puff, M. Bockmann, T. Kok, and W. Schuh, *J. Organometal. Chem.*, 268, 197(1984); M. Akkurt, T. R. Kok, P. Faleschini, L. Randaccio, H. Puff, W. Schuh, *J. Organometal. Chem.*, 470, 59(1994)].

However, few types of large polygermanosiloxane compounds have been synthesized and applied to the formation of optical materials. It is an object of this invention to provide methods for the synthesis of polygermanosiloxane materials which can be used as germanium-containing Spin-on-Glass (SOG) materials. SOG materials commonly are designed to lead to silica ($SiO_2$)like characteristics and fall into two categories called p-SOG and s-SOG. Both are based on organosiloxane molecules. Those that are polymeric with inert organic side chains, such as —$CH_3$, —$C_2H_5$, —$C_6H_5$, etc. are called p-SOG. Those with reactive side chains, such as —OH, —$OCH_3$, —$OC_2H_5$, —$O_2CH_3$, etc., which are capable of reacting with the other molecules to form polymerized $SiO_2$— like materials are called s-SOG. S. Ito, Y. Homma, E. Sasaki, S. Uchimura and H. Morishima, *J. Electrochemical Society*, Vol. 137, No 4, pp 1212–1218, 1990. However, analogous spin-on-glass materials based on organogermanosiloxanes are less common or not available. It is the object of this invention to introduce germanium into polysiloxanes to form germanium-containing SOG materials.

Electronic and optical systems often require films and other objects to function as dielectrics, waveguides, lenses, filters, lasers and other structures. Commonly they are made of silica-like materials that are formed from organosiloxane or other spin-on-glasses or precursors. The optical and electrical properties of silicas formed this way tend to fall in a limited range near those of amorphous $SiO_2$ itself. For some purposes, however, it would be advantageous to have analogous glassy materials with a substantially different set of properties, especially higher or lower refractive indices, and varied electrical and optical properties. It also would be valuable to have higher refractive index glasses with incorporated transition metal, lanthanide, actinide or other metal ions. And, it would be valuable to have materials that are chemically suited to interact with germanium-containing substrates including silicon, silica, germanium, and germanium-containing layers. Thus, it is also the object of this invention to provide a method to form germanium dioxide doped silicate glass films and other objects with the types of compositions and on the substrates mentioned above.

These and other objects and features of the invention will be apparent from the following summary and description of the invention and from the claims.

SUMMARY OF THE INVENTION

In accomplishing the foregoing and related objects, the invention provides a method of forming germanium containing polysiloxanes and a method of forming germanium containing silicate films and other objects on substrates such as silicon, silica, oxide glasses and others. Typically, polygermanosiloxanes with Ge—O—Si bond are synthesized from dialkyldicholorosilane and dialkyldichlorogermane in a two-phase reaction system, in which the alkyl groups attached to germanium or silicon are saturated hydrocarbon chain, unsaturated hydrocarbon chain or carboxyl terminated hydrocarbon chain with 1–8 carbons, in which the protons of the carboxyl groups can be replaced by metal ions such as alkali, transition metal, rare earth metal and other metal ions to form metal ion doped polydialkylgermanosiloxanes. Germanium esters of carboxyl-containing polydialkylsiloxanes with Ge—O—C=O bonds also are synthesized from the reaction of dialkylgermanol and carboxyl-containing polydialkylsiloxanes, in which the alkyl groups are saturated hydrocarbon chain or unsaturated hydrocarbon chain with 1–8 carbons. The invention also provides a method of forming germanium dioxide containing silicate films or patterns on silicon, silica and other substrates through thermal oxidation of the germanium-containing polysiloxanes mentioned above, and other oxidation method should also work upon the materials mentioned above to form germanium dioxide containing silicate films or pattern structures on silicon or silica.

DETAILED DESCRIPTION OF THE INVENTION

The present invention relates to novel polydialkylgermanosiloxanes and a process for making them. More particularly, the present invention relates to carboxyl containing polydialkylgermanosiloxanes, and to the use of them as precursors to form germanium dioxide containing silicate films on silicon, silica or oxide glass substrates, and to the use of their salts as precursors to form metal ion and germanium doped silicate films, and moreover to form metal ion and germanium doped silicate pattern structures on silicon, silica and other oxide glass substrates.

One type of composition prepared by a novel method of this invention can be represented by the following general Formula I:

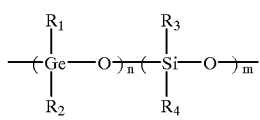

Formula I in which $R_1$–$R_4$ are identical or different alkyl, alkenyl, and functionalized alkyl and alkenyl radicals such as vinyl and cyanoalkyl radicals, including cyanopropyl, and n or m is a positive integer with n+m larger than 3, and n/(n+m) ranging 0.01–0.60.

In this invention, dialkyldichlorogermane is hydrolyzed to dialkylgermanium oxide tetramer according to Brown and Rochow's method [M. P. Brown and E. G. Rochow, *J. Am. Chem. Soc.*, 82, 4166(1960)]. The dialkylgermanium oxide tetramer is then hydrolyzed by water to form water solution of dialkylgermanol $R_1R_2Ge(OH)_2$ which then reacts with sodium hydroxide in excess and is believed to form sodium dialkylgermanolate which reacts with dialkyldichlorosilane in petroleum ether to form a polydialkylgernanosiloxane which stays in petroleum ether phase.

One of the attractive features of the invention is that a method of forming carboxyl containing polydialkylgermanosiloxanes in which carboxyl groups can enhance their binding to substrate surface and incorporate metal ions into the polydialkylgermano-siloxanes. One of the carboxyl-containing polydialkylgermanosiloxanes has the following general Formula II:

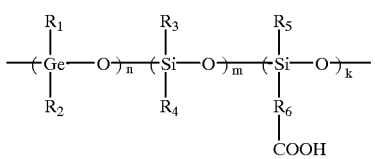

Formula II in which $R_1$–$R_5$ are identical or different alkyl radicals such as methyl, ethyl, propyl, butyl, pentyl, hexyl, heptyl and octyl, and vinyl, and $R_6$ is a polymethylene group with 1 to 6 carbons, and n, m or k is a positive integer with n+m+k larger than 3 and probably less than 50, and n/(n+m+k) ranging from 0.01–0.40, and k/(n+m+k) ranging from 0.01–0.80, and m/(n+m+k) ranging from 0.20–0.80.

In this synthetic method of the invention, poly(cyanoalkylalkyl)siloxane is synthesized from the hydrolysis of cyanoalkylalkyldichlorosilane and the cyano group in the polysiloxane is then hydrolyzed by hydrochloric acid into carboxyl group. Sodium hydroxide is then employed to hydrolyze Si—O—Si bond of the polysiloxane to form a water solution of $NaOOCR_6Si(ONa)_3$ which then reacts with dialkyldichlorogermane and dialkyldichlorosilane in diethyl ether to form carboxylated polydialkylgermanosiloxanes with the structure shown above (Formula II). In the reaction, sodium hydroxide is neutralized by hydrochloric acid released from the hydrolysis of dialkyldichlorogermane and dialkyldichlorosilane, and the product is transferred to ethyl ether phase.

Another type of carboxyl- and vinyl- containing polygermanosiloxane also can be synthesized by the general method described for the compounds described by Formula II, but with additional comonomers, to lead to compounds of the type described by Formula III.

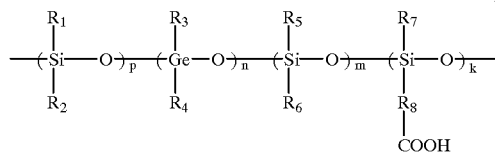

Formula III

Here, $R_1$ through $R_7$ can be alkyl, alkenyl groups or their derivatives, and either $R_1$ or $R_2$ is different than either of $R_5$ or $R_6$. Also, $R_8$ is an alkyl group.

In addition to the carboxylated polydialkylgermanosioxanes with carboxyl groups attaching to silicon through polymethylene groups, carboxylated germanium sesquioxide siloxane copolymers with carboxyl groups attaching to germanium through polymethylene groups are synthesized by a method provided in the invention. These are carboxylated germanium sesquioxide siloxane copolymers and have following general Formula IV:

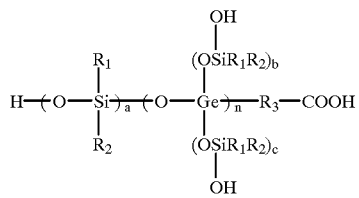

Formula IV in which $R_1$ and $R_2$ are identical or different alkyl radicals such as methyl, ethyl, propyl, butyl, pentyl, hexyl, heptyl and octyl, and vinyl, and $R_3$ is a alkyl $(CH_2)_n$ group with 1 to 6 carbons, and n/(n+a+b+c) ranges from 0.01 to 0.33.

Carboxyl- and vinyl- containing germanium sesquioxide siloxane copolymers can be synthesized according to the methods of this invention and correspond to the Formula V

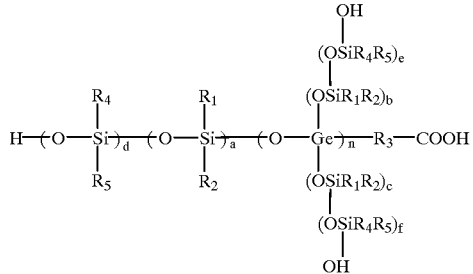

Formula V in which $R_1$ and $R_2$ are identical or different alkyl radicals such as methyl, ethyl, propyl, butyl, pentyl, hexyl, heptyl and octyl, and vinyl, and $R_3$ is a alkyl, or polymethylene $(CH_2)_n$ group with 1 to 6 carbons, $R_4$ can be an alkyl group, such as methyl, or an alkenyl group, such as a vinyl or a substituted vinyl group, a, b, c, d, e and f can be zero or a positive integer, n is a positive integer, and n+a+b+c+d+e+f is larger than 3, and n/(n+a+b+c+d+e+f) ranging from 0.01–0.33.

The compositions of this invention are prepared by the reaction of dialkyl-dichlorosilane in diethyl ether and a water solution of $NaOOCR_3Ge(ONa)_3$, which is the hydrolysis product of $[HOOCR_3GeO_{1.5}]_2$ by sodium hydroxide. The product is formed at the interface of the two-phase system and is transferred to diethyl ether phase which is thought to prevent the Ge—O bond from being hydrolyzed by water in the inorganic phase after being formed.

Besides incorporation of germanium into the polysiloxane backbone, another method of incorporating germanium into polysiloxane in this invention is to form germanium esters of carboxylated polysiloxanes. The germanium esters of carboxylated polysiloxane have the general formulas Formula VI and Formula VII.

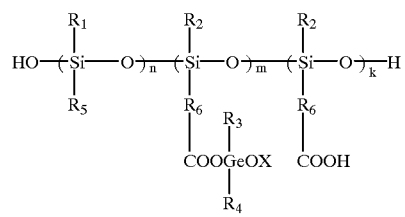

Formula VI

In this formula $R_1$–$R_5$ are identical or different alkyl or alkenyl radicals such as methyl, ethyl, propyl, butyl, pentyl, hexyl, heptyl and octyl, and vinyl, $R_6$ is an alkyl or alkenyl fragment with 1 to 6 carbons, and X is H or C, and n, m and k are positive integers with m/(n+m+k) ranging from 0.01–0.99.

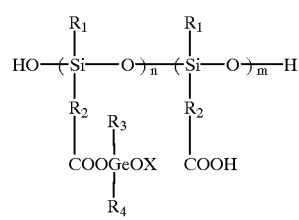

Formula VII

In this formula $R_1$, $R_3$, and $R_4$ are identical or different alkyl or alkenyl radicals such as methyl, ethyl, propyl, butyl, pentyl, hexyl, heptyl and octyl, and vinyl, $R_2$ is an alkyl or alkenyl fragment with 1 to 6 carbons, and X is H or C, and n and m are positive integers with m/(n+m) ranging from 0.01–0.99.

These compositions of this invention are prepared by the reaction of ethanol or acetone solution of carboxyl-containing polydialkylsiloxane with water solution of dialkylgermanol which is achieved by hydrolysis of dialkylgermoxane in water. The solvents in the reaction are evaporated under heat and vacuum oven.

The germanium dioxide containing silicate films on substrates such as silicon, silica and other oxide glasses are achieved through thermal oxidation of the germanium containing polysiloxane films which are prepared from a solution of the germanium containing polysiloxanes in an organic solvent, such as ethanol, acetone, diethyl ether or mixture of them, which then evaporates in air. The oxidation of the germanium containing polysiloxane films in an oven is carried out using a particular heating process which results in crack-free germanium dioxide-containing silicate, or germanosilicate, films.

The present invention is further illustrated by the following examples. It is to be understood that the present invention is not limited to the examples, and various modifications and changes may be made without departing from the spirit and scope thereof.

EXAMPLE 1

Preparation of carboxylated polygermanosiloxane, CPGS. First, a carboxylated siloxane, H100PSI (Formula VIII) was synthesized as

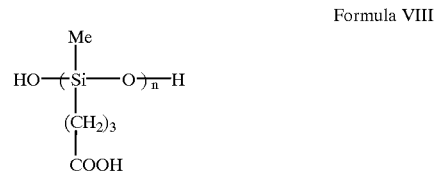

Formula VIII follows. A 20 g sample of 3-cyanopropylmethyldichlorosilane was placed in a round bottom flask and stirred while water was added dropwise. The mixture was stirred at room temperature for 3 hours and then heated in a water bath at about 70° C. for 20 hours to form cyanopropyl-containing polysiloxane polymer. Then 20 mL of 8M HCl was added to the flask to convert the cyano groups into carboxylic acid groups. The reaction was carried out with the flask in the water bath at 70° C. for about 20 hours. Then 50 mL of water was added to the flask to take up the HCl and $NH_4Cl$ produced and present with the carboxylated polysiloxane. The water was allowed to stay on the top of the viscous product for 6 hours. The water containing the HCl and $NH_4Cl$ was decanted, and an additional 50 mL of water was added to the flask. This step was repeated several times until the pH value of the decanted water was about 7. Then 100 mL of acetone was added to the flask to dissolve the product. The acetone phase was separated from $NH_4Cl$ on the bottom of the flask, and then dried with anhydrous $Na_2SO_4$ overnight. Acetone then was evaporated at reduced pressure to leave a viscous product.

A sample of the H100PSI (0. 4657 g) was mixed with 20.0 mL $H_2O$ and 0.3966 g NaOH and kept in a capped glass bottle for 3 days at 70° C. The resultant solution was placed in a 125 mL flask at 25° C. and 80 mL of diethyl ether was added. Then 0.26 mL of dichlorodimethyl germane and, 2.1 mL of dichlorodimethylsilane were added to this mixture. The two phases were stirred for 3 hours at 25° C. with a reflux condenser in place. Then the ether phase was separated and dried with anhydrous sodium sulfate. Then the ether was evaporated from the ether solution at reduced pressure to yield a viscous fluid product. It was shown by infrared spectroscopy to contain silicon-oxygen-germanium (970 $cm^{-1}$) and silicon-oxygen-silicon (1000–1100 $cm^{-1}$) bonds, and carboxylate groups in the acid form (1712 $cm^{-1}$). From proton nuclear magnetic resonance (H-NMR) spectroscopy, the dimethyl germanium containing groups comprised 7.7 mol %, the dimethyl silicon containing groups comprised 68.8 mol %, and the methyl carboxypropyl silicon containing groups comprised 23.5 mol %. Thus, the composition of this CPGS is represented stoichiometrically, but not necessarily in terms of monomer sequence, by Formula II with $R_1$ to $R_5$ being methyl groups and & being tri methylene group (propane radical) $(CH_2)_3$. In this case n, m and k are the mole fractions such that n+m+k=1, and n=0.077, m=0.688 and k=0.235.

EXAMPLE 2

A compound was made by the method of Example 1 but with the following different amounts of reactants. H100PSI (0.3957 g) was mixed with 20 mL $H_2O$ and 0.3375 g NaOH. The reaction product was combined with 80 mL of diethyl ether, 0.45 mL dichlorodimethyl germane, and 1.55 mL of dichlorodimethyl silane.

After reaction and isolation as described in Example 1, a viscous fluid product was obtained. Its infrared spectrum showed it to contain silicon-oxygen-germanium, silicon-oxygen-silicon, and carboxylate features. From this and the H-NM spectrum, the CPGS product was found to have the general composition shown at the end of Example 1, Formula II, except that n=0.164, m=0.623 and k=0.213, where n+m+k=1.

EXAMPLE 3

Preparation of a carboxylated germanium sesquioxide siloxane copolymer (CGSS). In this preparation, 1.0065 g of carboxyethyl germanium sesquioxide (obtained from Gelest Inc, Tullytown Pa., Cat No GE C2100) was combined with 20.0 mL of water and 0.95 g of sodium hydroxide and allowed to react for 12 hours at 70° C. in a capped glass bottle. Then this product was cooled to 25° C. and placed in a 250 mL single neck round bottom flask with 50 mL of diethylether and 6.5 mL of dichlorodimethylsilane (Aldrich Chemical Co., Cat No. D6,082-6) and a reflux condenser was placed in the neck. This mixture was stirred for 3 hours at 25° C. Then the ether phase containing the product was dried with anhydrous sodium sulfate. This drying solid was separated from the ether phase. The ether was removed from the ether phase under reduced pressure. The resultant viscous product is believed to be represented by general Formula IV with $R_1$ and $R_2$ being methyl groups and $R_3$ is an ethane radical, $(CH_2)_2$.

The existence of the germanium-oxygen-silicon (ca. 970 $cm^{-1}$) silicon-oxygen-silicon (1000–1100 $cm^{-1}$) and carboxylate groups (ca. 1712 $cm^{-1}$) as well as the features expected from the formula, such as $CH_3$ on Si at 1260 $cm^{-1}$, was shown by infrared spectroscopy. The H-NMR spectrum of the product was obtained and interpreted to show that n/(a+b+c) is 7.5/92.5 or 0.081.

EXAMPLE 4

The preparation of the CGSS material of Example 3 was repeated but with 1.544 g of carboxyethyl germanium sesquioxide, 20.0 mL of water and 1.456 g sodium hydroxide in the first step. In the second step, 6.1 mL of dicholorodimethyl silane was used. The resultant product was characterized similarly with n/(a+b+c)=9.4/90.6 or 0.104.

EXAMPLE 5

The material whose preparation is described in Example 4 was stored at room temperature for 10 days in a capped glass bottle. After this period, the resultant material had a significantly greater viscosity than the starting material as observed from its flow properties in the bottle.

EXAMPLE 6

Preparation of a germanium ester of H100PSI. This is a GE-Y-PSI-Z compound with general Formula VII, where Y gives the amount of germanium ester formed and Z gives the carboxyl content of the polymer, of the type GE-20-PSI-100.

In this preparation, 0.4525 g of H100PSI was dissolved in 10.0 mL of ethanol. Also, 0.0759 g of tetrameric dimethylgermanium oxide (which was synthesized from dichlorodimethylgermane (Gelest, Inc) according to method described by Rochow (M. P. Brown and E. G. Rochow, J. Am. Chem. Soc., 82, 4166(1960)) was dissolved in 1.0 mL of water at room temperature for 4 hours. The two solutions were mixed in a 20 mL bottle. The mixture in the uncapped bottle was then held in a drying oven at 70° C. for 12 hours to evaporate the ethanol and water. The product in the bottle then was dried in a vacuum oven at 60° C. for 4 hours.

The product can be represented by Formula VII wherein X can be H, Ge, Si or C. It appears that X initially and for sometime (at least 1 week) is H primarily. However, since the viscosity of the product increases very gradually with time, it appears that condensation occurs between these OH groups and other carboxylates or Si—OH end groups to form larger molecules. Thus, a range of viscosities and products can be obtained by controlled aging of the initial product. They have the same Si:Ge ratios as the initial products but they can attain viscosities and solubilities that offer advantages for specific applications. The infrared spectrum of the initial product shows the germanium ester form (1688 $cm^{-1}$) in addition to the expected features of H100PSI. The germanium to silicon mole ratio overall is 2 to 10 or 0.2 This material is designated GE-20-PS-100 since 20% of the Si units in H100 PSI have been formed into germanium ester form.

EXAMPLE 7

The preparation of a germanium ester of H100PSI was repeated following the procedureofExample 6 but using 0.2384 g of H100PSI in 10.0 ml of ethanol and 0.1292 g of tetrameric dimethylgermanium oxide in 1.0 mL of water. The mole ratio of germanium to silicon is 4 to 10 or 0.4. This is GE-67-PSl100.

EXAMPLE 8

The preparation of a germanium ester of H14PSI was carried out in the manner of Example 6 but with 0.66 g of H14PSI in 10 ml of diethylether and 0.28 g of tetrameric dimethylgermanium oxide in 0.25 mL of water. The mole ratio of germanium to silicon is 2.35 to 79, or 0.3. This product, a viscous liquid, exhibited the infrared spectral feature at 1688 $cm^{-1}$. It is Ge-30-PS-14 and is given by the general Formula VI.

EXAMPLE 9

A wafer of silicon was dip coated with a carboxylated germanium sesquioxide sixonane copolymer of the type represented by the general Formula IV with n/(n+a+b+c) of 0.2. Then it was placed in a 254 nm UV reactor for 18 hours for crosslinking. Then it was placed into a solution containing erbium(III)acetylacetonate in ethanol for 25 minutes. Then the sample was removed from the solution and dried in a vacuum oven at 120° C. for 18 hours. The infrared spectrum confirmed that ion exchange had occurred.

EXAMPLE 10

A sample of the CPGS copolymer prepared in Example 2 was dissolved in diethylether at a concentration of $3 \times 10^{-2}$ g/mL. A small amount of the solution, about $2 \times 10^{-5}$ mL, was drawn into a thin glass capillary tube (OD=1.15 mm and ID=0.25 mm) by capillary action. Then a part of this amount of solution was added to the space at the junction of a silicon V-groove and a silica optical fiber by touching the liquid at the end of the tube to this region of the fiber. The amount added is estimated to be about $1 \times 10^{-5}$ mL.

The silicon V-groove used consisted of a piece of silicon wafer, about 0.5 mm thick and 2.47 mm wide with a V-shaped groove cut into it so that an optical fiber could rest in the groove. A short piece of fiber (about 2.5 cm) was placed with one end in one V-groove and the other end in a second V-groove facing the first one. The two V-groove bases were supported by a flat silicon wafer. The application of the CPGS solution to this structure was done to the V-groove fiber junction, as described above, and also to the region near the junction of the V-groove-cntaining silicon pieces and the silicon wafer substrate.

This structure was placed in a tube furnace and heated in the air according to the following schedule: (a) 25° C. to 200° C. over 0.5 h, (b) at 200° C. for 0.5 h, (c) to 250° C. over 5 min and at 250° for 0.5 h, (d) to 500° C. over 25 min and at 500° C. for 1 h, (e) to 550° C. over 5 min and at 550° C. for 0.5 h, and (f) to 600° C. over 5 min and at 600° C. for 1.5 h. Then the furnace was turned off and was allowed to cool to about 70° C. Then the sample structure was removed.

The fiber was well adhered to the V-groove according to several criteria. First, when the structure was inverted, the fiber did not fall out of the V-grooves. Second, when the structure was inverted and then tapped with a pencil on the opposite surface of the substrate, the fiber did not disengage from the V-groove and the V-groove structures did not disengage from the silicon wafer substrate. Third, a sharp blade was used to cut the fiber near one V-groove support and to pry off that support. Following those actions, the remaining section of the fiber protruded from the first V-groove support and remained attached to it horizontal position parallel to the surface of the silicon wafer base. Examination of the remaining structure under 10× magnification indicated that the CPGS polymer had reacted to form a monolithic attachment structure at the fiber—V-groove junction region and, before forced detachment, in the part of the silicon wafer—silicon V-groove interface into which the polymer solution had gone when it was applied to the region near these pieces.

EXAMPLE 11

A sample of the CPGS polymer prepared in Example 2 was dissolved in diethyl ether at a concentration of $3 \times 10^{-2}$ g/mL solution. This solution was dropped onto a silicon wafer substrate. The drops were added so as to cover the substrate with liquid, then the structure was covered by an inverted Petri dish to allow for relatively slow solvent evaporation and formation of a film which appeared uniform. This process was repeated until a film of about 10 microns thickness was obtained.

This structure was heated in a tube flilnace in air according to the following sequence: (a) 25–200° C. at 40° C./min, (b) at 200° C. for 30 min, (c) from 200° C. to 250° C. in about 1.5 min and at 250° C. for 30 min, (d) from 250° C. to 500° C. in about 6.5 min and at 500° C. for 80 min, (e) from 500° to 550° C. in about 1.5 min at 550° C. for 120 min, and (f) from 550° C. to 600° C. in about 1.5 min and at 600° C. for 120 min.

The infrared spectrum of the film showed that it is a germanosilicate glass, and from the spectrum the thickness is estimated to be 0.8 micrometers.

EXAMPLE 12

A sample of the CGSS material prepared in Example 4 was dissolved in diethyl ether and deposited as a CGSS film on a silicon substrate in the manner described in Example 9. It was heated according to Example 11 in a tube furnace analogously except that the heating time at 500° C. was 120 min, that at 550° C. was 30 min, and that at 600° C. was 150 min. The furnace was turned off and allowed to cool. After cooling in the furnace to 50° C., it was removed. The infrared spectrum of the film showed it to be germanosilicate glass and to have a thickness, estimated from the infrared spectrum, of 0.7 micrometers. The refractive index was found to be 1.503 at 632.8 nm.

EXAMPLE 13

An approximately 10 micron thick film of the GE-20-PS-100 material prepared in Example 6 was placed on a silicon wafer. It then was heated in air in a tube furnace according to the schedule (a) 25° C. to 200° C. at 40° C./min, (b) at 200° C. for 30 min, (c) 200° C. to 250° C. in about 1.5 min and at 250° C. for 60 min, (d) 250° C. to 500° C. in about 6.5 min and at 500° C. for 75 min, (e) 500° C. to 550° C. in about 1.5 min and at 550° C. for 20 min (f) 550° C. to 600° C. in about 1.5 min and at 600° C. for 190 min. After cooling in the furnace to 50° C., it was removed. The infrared spectrum of the film showed it to be germanosilicate glass and to have a thickness, estimated from the infrared spectrum, to be 1.5 micrometers. The refractive index was found to be 1.456 at 632.8 nm.

The methods exemplified in the examples lead to polymer and compositions from very low germanium content, selected by varying the relative amount of the germanium compound in the synthesis in a manner that will be available to one normally skilled in the field, to a germanium content that is the same as the silicon content. The latter also will be evident to one normally skilled in the art. The examples illustrate this by detailing the syntheses of the materials in which from 7.7 to 40% of the group IV A (group 14) atoms are Ge, but it is clear that the methods apply to compounds comprising from about 0.01 to 50 mol % at least. It is possible for gernanosiloxane materials to evaporate themselves or to react with themselves or other molecules in their environment to form volatile compounds containing germanium and silicon and then for these products to evaporate and for the chemical vapor so formed to be deposited on a substrate to collect it or to react it further, as by thermal decomposition or thermal oxidation, to form products on or from the substrates.

The methods exemplified lead to glass compositions in which the Ge to Si atom ratios are from an arbitrarily small value, obtained by conversion to glass of a GE-X-PSI-Z material with Z varying from a very small value to 0.99. It will be obvious to one skilled in the art how to obtain any composition in this range by suitable variations in the polymeric materials used as glass precursors and the heating conditions. Those variations can include controlling the composition of the atmosphere in which the samples are heated. Two types of variations are contemplated. The first is over the relative amounts of the constituents of air, including oxygen, nitrogen, water, and carbon dioxide. The second is the constituents that may be useful for some other processes or materials to which the polymer glass and substrate are exposed. For example, these could include compounds used in reactive ion etching, compound formation, ion implantation, and the like.

The thickness of the glass materials formed from the polymers and the substrates on which they can be formed are variables by which one normally skilled in the art can vary over wide ranges. The substrates employed here include silicon and silica-based glass, but substrates ranging from sapphire (alumina), borosilicate glass (Asahi Glass Co.), and potassium bromide (KBr crystals) have been used, and germanium, germanium or silicon oxides, nitrides, and the like are contemplated in this invention. Thickness of individual layers of from less than 0.1 up to about 2 micrometers of glass film have been obtained on silicon substrates. Obtaining greater thicknesses by making multilayer structures is an obvious extension and is contemplated as part of this invention.

The method of heating these polymeric materials to form glass films or junctions is part of this disclosure, but it should be obvious to one in the field that modifications can be made within the invention. These include such variations in heating source and time that lead to substantially equivalent products. Thus, heating with a laser or another spatially directed energy source is contemplated, since it could be an effective way to heat a fiber-V-groove junction while minimizing the heating of waveguide structure, for example.

The invention has been described with reference to the preferred embodiement. Obviously, modifications and alterations will occur to others upon a reading and understanding of the proceeding detailed description. It is intended that the invention be construed as including all such alterations and modifications insofar as they come within the scope of the claims or the equivalent thereof.

Having thus described the invention, it is claimed:

1. A method for producing a polygermanosiloxane composition having the composition represented by Formula I:

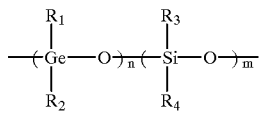

Formula I in which $R_1$–$R_4$ are identical or different alkyl, alkenyl, or functionalized alkyl and alkenyl radicals with n/(n+m) ranging from 0.01 to 0.60, comprising:

(i) combining a solution of a polar solvent in a second solvent that is immiscible with said polar solvent, wherein said polar solvent comprises a hydrolysis product of an alkylgermanium oxide compound with an alkylhalosilane or an alkylalkoxysilane; and (ii) isolating said polygermanosiloxane from said second solvent.

2. The method of claim 1, wherein the alkylgermanium oxide compound is dimethyl germanium oxide tetramer.

3. The method of claim 1, wherein the alkylhalosilane is dimethyldichlorosilane.

4. The method of claim 1, wherein the polar solvent is selected from the group consisting water and solution of sodium hydroxide in water.

5. The method of claim 1, wherein the second solvent is selected from the group consisting of petroleum ether and diethyl ether.

6. A method for producing a carboxylated polygermanosiloxane composition represented by Formula II,

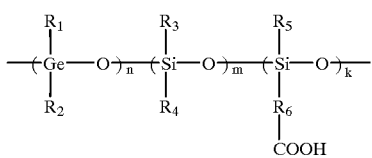

Formula II wherein $R_1$–$R_5$ are identical or different alkyl or alkenyl radicals, and $R_6$ is $(CH_2)_x$, with x being from 1 through 6, and n/(n+m+k) ranges from 0.01–0.40, k/(n+m+k) ranges from 0.01–0.80, and m/(n+m+k) ranges from 0.20–0.80, comprising the steps of combining a solution of $R_5Si(R_6COOM)(OM)_2$, wherein M is Na, prepared by the hydrolysis of a compound $(R_5Si(R_6COOH)O)_n$ in a polar solvent with a solution of $(R_1)(R_2)GeX_2$ and $(R_3)(R_4)SiY_2$ in a second solvent that is immiscible with the polar solvent, where X and Y are halides or alkoxides, and isolating the product from the second solvent.

7. The method of claim 6, wherein the polar solvent is selected from the group consisting water and a solution of sodium hydroxide in water.

8. The method of claim 6, wherein the second solvent is selected from the group consisting of diethyl ether and petroleum ether.

9. A carboxylated polygermanosiloxane produced by the method of claim 6 comprising a composition represented by Formula II,

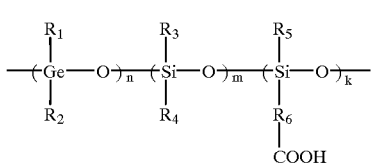

Formula II wherein $R_1$–$R_5$ are identical or different alkyl radicals chosen from the C1 through C8 alkyl radicals and $R_6$ is a polymethylene radical, $(CH_2)_x$, with x being from 1 through 6, and n/(n+m+k) ranges from 0.01–0.40, k/(n+m+k) ranges from 0.01–0.80, and m/(n+m+k) ranges from 0.20–0.80.

10. A carboxylated polygermanosiloxanes produced by the method of claim 6 comprising a composition represented by Formula II,

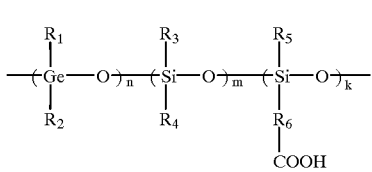

Formula II wherein $R_1$, $R_2$, $R_3$ and $R_5$ are identical or different alkyl radicals chosen from the C1 through C8 alkyl radicals, $R_4$ is an alkenyl radical, and $R_6$ is a polymethylene radical, $(CH_2)_x$, with x being from 1 through 6, and n/(n+m+k) ranges from 0.01–0.40, k/(n+m+k) ranges from 0.01–0.80, and m/(n+m+k) ranges from 0.20–0.80.

11. A carboxylated polygermanosiloxane produced by the method of claim 6 comprising the compositions represented by Formula II,

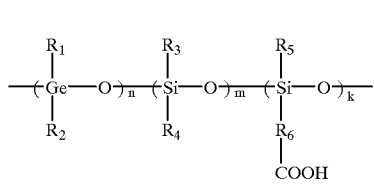

Formula II wherein $R_1$, $R_3$, $R_4$ and $R_5$ are identical or different alkyl radicals chosen from the C1 through C8 alkyl radicals, $R_2$ is and alkenyl radical such as a vinyl group, and $R_6$ is a polymethylene radical, $(CH_2)_x$, with x being from 1 through 6, and $n/(n+m+k)$ ranges from 0.01–0.40, $k/(n+m+k)$ ranges from 0.01–0.80, and $m/(n+m+k)$ ranges from 0.20–0.80.

12. A carboxylated polygermanosiloxane produced by the method of claim 6.

13. A method for preparing a carboxylated germanium sesquioxide siloxane copolymer of a composition represented by Formula IV:

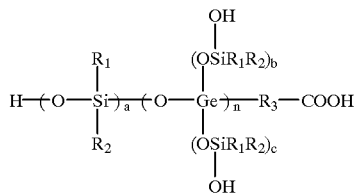

Formula IV wherein $R_1$–$R_2$ are identical or different alkyl or alkenyl radicals, and $R_3$ is $(CH_2)_x$, with x being from 1 through 6, and $n/(a+b+c+n)$ ranges from 0.01–0.33, comprising the steps of combining a solution of the base hydrolysis product of a carboxyalkyl germanium sesquioxide in a polar solvent with a solution comprising $(R_1)(R_2)SiX_2$ in a second solvent that is immiscible with the polar solvent, where X is a halide or alkoxide, and isolating the product from the second solvent.

14. The method of claim 13, wherein the polar solvent is selected from the group consisting water and a solution of sodium hydroxide in water.

15. The method of claim 13, wherein the second solvent is selected from the group consisting of diethyl ether and toluene.

16. A carboxylated germanium sesquioxide siloxane copolymer produced by the method of claim 13.

17. A method for preparing a carboxylated germanium sesquioxide siloxane copolymer of the composition represented by Formula V:

Formula V wherein $R_1$, $R_2$, $R_4$, and $R_5$ are identical or different alkyl or alkenyl radicals, at least one of which is an alkenyl group, and $R_3$ is $(CH_2)_x$, with X being from 1 through 6, and $n/(n+a+b+c+d+e+f)$ ranges from 0.01–0.33, comprising the steps of combining a solution of the base hydrolysis product of a carboxyalkyl germanium sesquioxide in a polar solvent with a solution of $(R_1)(R_2)SiX_2$ and $(R_4)(R_5)SiY_2$ in a second solvent that is immiscible with the polar solvent, where X and Y are halides or alkoxides, and isolating the product from the second solvent.

18. The method of claim 17, wherein the polar solvent is selected from the group consisting water and a solution of sodium hydroxide in water.

19. The method of claim 17, wherein the second solvent is selected from the group consisting of diethyl ether and toluene.

20. A carboxylated germanium sesquioxide siloxane copolymer produced by the method of claim 17.

21. A carboxylated germanium sesquioxide siloxane copolymer comprising the composition represented by the Formula IV:

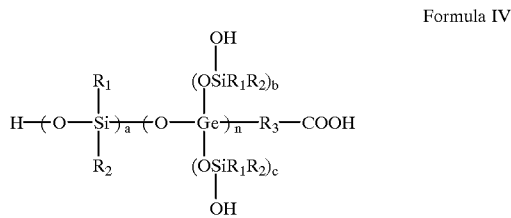

Formula IV wherein $R_1$ and $R_2$ are identical or different alkyl radicals chosen from C1 through C8 alkyl radicals, and $R_3$ is $(CH_2)_x$ with x from 1 through 7, and $n/(n+a+b+c)$ ranges from 0.01 to 0.33.

22. A carboxylated germanidum sesquioxide siloxane copolymer composition comprising the composition represented by the Formula V:

Formula V

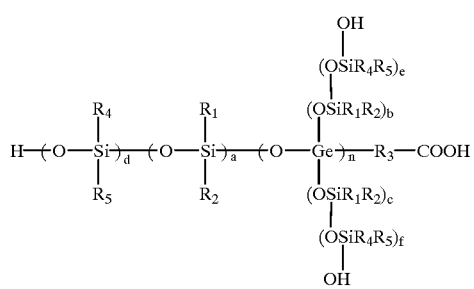

wherein $R_1$, $R_2$, $R_4$, and $R_5$ are identical or different alkyl or alkenyl radicals chosen from $C_1$–$C_8$ alkyl or alkenyl radicals, at least one of which is an alkenyl group $R_3$ is $(CH_2)_x$ with $x=1$–$7$, and $n/(n+a+b+c+d+e+f)$ ranges from 0.01 to 0.33.

23. A method for producing a germanium ester of a carboxylated polysiloxane comprising the steps of mixing a solution of a carboxylated polysiloxane, represented by Formula VIII Formula VIII

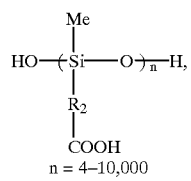

in a polar solvent with a solution of the hydrolysis product of an alkyl germanium oxide compound in a polar solvent, wherein the solutions are mixed in amounts required to obtain products represented by Formula VII Formula VII

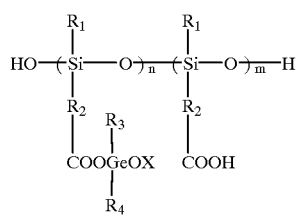

where $n/(n+m)$ is in the range of 0.01 to 0.99, and $R_1$, $R_3$, and $R_4$ are $(CH_2)_x$, with x being from 1 through 8, $R_2$ is $(CH_2)_x$ with $x=1$–$7$, and X is a compound containing H, C, Ge or Si.

24. The germanium ester of a carboxylated polysiloxane produced by the method of claim 23.

25. A germanium ester of a carboxylated polysiloxane with formula VII

Formula VII

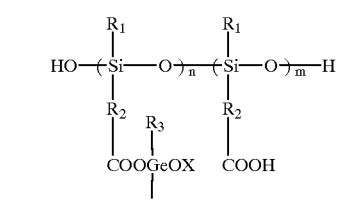

wherein $R_1$, $R_3$, and $R_4$ are identical or different alkyl or alkenyl radicals chosen from $C_1$–$C_8$ alkyl or alkenyl radicals, and $R_2$ is $(CH_2)_x$ with $x=1$–$7$, X is a compound containing H, C, Ge or Si, and $n/(n+m)$ is in the range 0.01 to 0.99.

26. A germanium ester of a carboxylated polysiloxane with formula VI

Formula VI

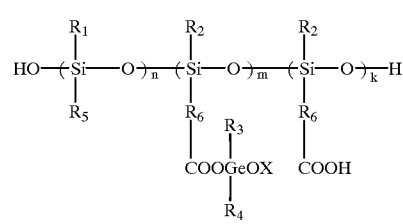

wherein $R_1$, $R_2$, $R_3$, $R_4$, and $R_5$ are identical or different alkyl or alkenyl radicals chosen from $C_1$–$C_8$ alkyl and alkenyl radicals, and in which $R_6$ is $(CH_2)_x$ with $x=1$–$7$, X is a compound containing H, C, Ge or Si, and $m/(n+m+k)$ ranges from 0.01–0.60.

27. A germanium ester of a carboxylated polysiloxane with formula VI

Formula VI

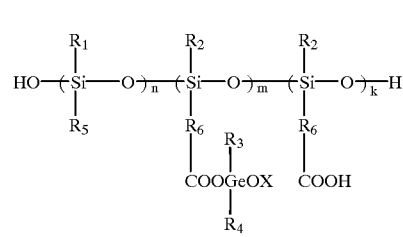

wherein $R_1$, $R_2$, $R_3$, $R_4$ and $R_5$ are identical or different alkyl or alkenyl radicals chosen from $C_1$–$C_8$ alkyl and alkenyl radicals, at least one of which is a vinyl or other alkenyl group, and in which $R_6$ is $(CH_2)_x$ with $x=1$–$7$, X is a compound containing H, C, Ge or Si, and $m/(n+m+k)$ ranges from 0.01–0.60.

28. A glassy layer produced by depositing a precursor material with the Formula

Formula I

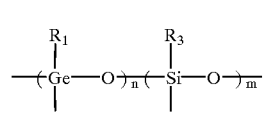

where, $n/(n+m)$ ranges from 0.01 to 0.60, $R_1$, $R_2$, $R_3$, and $R_4$ are identical or different alkyl or alkenyl radicals chosen from $C_1$–$C_8$ alkyl or alkenyl radicals, at least one of which is an alkenyl group, on an object in which germanium to silicon mole ratio ranges from 0.01 to 1.00 the thickness of the deposit is 0.01 to 0.5 micrometers.

29. A method for producing the glassy layer in claim 28 wherein the precursor represented by Formula I is deposited on an object and heated in an oven in air according to the following time-temperature program,
   a) from room temperature to 400° C. at 40° C./min, b) at 400° C. for about one hour, c) from 400° C. to 600° C. at at 40° C./min, and d) at 600° C. for about one hour.

30. A glassy layer produced by depositing a precursor material with the Formula II

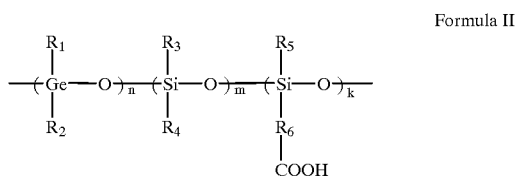

Formula II wherein $R_1$–$R_5$ are identical or different alkyl or alkenyl radicals, and $R_6$ is $(CH_2)_x$, with x being from 1 through 6, and n/(n+m+k) ranges from 0.01–0.40, k/(n+m+k) ranges from 0.01–0.80, and m/(n+m+k) ranges from 0.20–0.80, on an object in which germanium to silicon mole ratio ranges from 0.01 to 1.00, wherein the thickness of the deposit is 0.01 to 4 micrometers.

31. A method for producing the glassy layer in claim 30 wherein the precursor is dissolved in organic solvent, and is deposited on the object to form a polymer film, and the film is heated in an oven in air according to the following time-temperature program,
   a) from room temperature to 200° C. at 40° C./min, b) at 200° C. for 30 min, c) from 200° C. to 250° C. in about 1.5 min and at 250° C. for 30 min, and d) from 250° C. to 500° C. in about 6.5 min and at 500° C. for 80 min, e) from 500° C. to 550° C. in about 1.5 min and at 550° C. for 120 min, and f) from 550° C. to 600° C. in about 1.5 min and at 600° C. for 120 min.

32. Ionomers of a germanosiloxane copolymer, formed by a process selected from a metal ion exchange reaction and a coordination reaction, where the metal ion is selected from the group consisting of lanthanide, transition metal, alkali metal, and alkaline earth metal ion.

33. A glassy layer produced by the thermal oxidation of the materials with the Formula IV

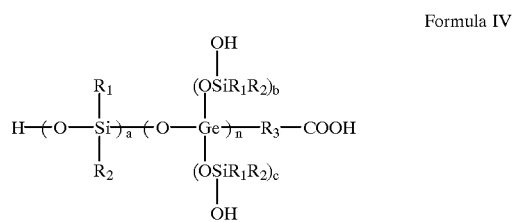

Formula IV wherein $R_1$–$R_2$ are identical or different alkyl or alkenyl radicals, and $R_3$ is an alkyl or alkenyl radical with 1 to 6 carbons, and n/(a+b+c+n) ranges from 0.01–0.33, on an object, and in which germanium to silicon mole ratio ranges from 0.01 to 0.50, and wherein the thickness of the deposit is 0.01 to 4 micrometers.

34. A method for producing the glassy layer in claim 33, wherein the precursor is dissolved in organic solvent, and is deposited on the object to form a polymer film, and the film is heated in an oven in air according to the time-temperature program,
   (a) 25–200° C. at 40° C./min, (b) at 200° C. for 30 min, (c) from 200° C. to 250° C. in about 1.5 min and at 250° C. for 30 min, (d) from 250° C. to 500° C. in about 6.5 min and at 500° C. for 120 min, (e) from 500° to 550° C. in about 1.5 min at 550° C. for 30 min, and (f) from 550° C. to 600° C. in about 1.5 min and at 600° C. for 150 min.

35. A glassy layer produced by the thermal oxidation of materials with the Formula VII

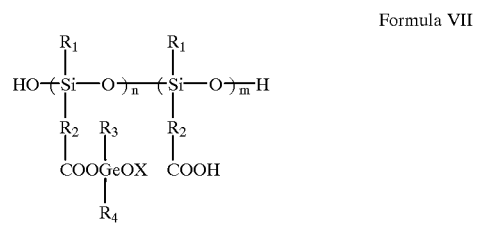

Formula VII on an object including silicon, silica, or oxide glasses, said materials comprising germanium dioxide and silicon dioxide, in which the germanium to silicon mole ratio ranges from 0.01 to 1.00 wherein the thickness of the deposit is 0.01 to 4 micrometers wherein $R_1$, $R_3$, and $R_4$ are alkyl groups and wherein $R_2$ is $(CH_2)_x$, with x being from 1 through 6, and where X is a compound containing H, C, Ge or Si.

36. A method for producing the glassy layer in claim 35 wherein the precursor is dissolved in organic solvent, and is deposited on the object to form a polymer film, and the film is heated in an oven in air according to the time-temperature program; heating from (a) 25° C. to 200° C. at 40° C./min, (b) at 200° C. for 30 min, (c) 200° C. to 250° C. in about 1.5 min and at 250° C. for 60 min, (d) 250° c. to 500° C. in about 6.5 min and at 500° C. for 75 min, (e) 500° C. to 550° C. in about 1.5 min and at 550° C. for 20 min (f) 550° C. to 600° C. in about 1.5 min and at 600° C. for 190 min.

37. The method of claim 1, wherein said $R_1$–$R_4$ include vinyl and cyanoalkyl radicals.

38. The method of claim 6, wherein $R_6$ is a polymethylene radical.

39. The carboxylated polygermnanosiloxane of claim 10, wherein said $R_4$ is a vinyl group.

40. The method of claim 13, wherein said $R_3$ is a polymethylene radical.

41. The method of claim 17, wherein at least one of said $R_1$, $R_2$, $R_4$, and $R_5$ is a vinyl group.

42. The carboxylated germanium sesquioxide siloxane copolymer composition of claim 22, wherein at least one of said $R_1$, $R_2$, $R_4$, and $R_5$ is a vinyl group.

43. The glassy layer of claim 28, wherein at least one of said $R_1$, $R_2$, $R_3$, and $R_4$ is a vinyl group.

44. The glassy layer of claim 30, wherein said $R_6$ is a polymethylene radical.

45. The glassy layer of claim 33, wherein said $R_3$ is a polymethylene radical.

* * * * *